(12) United States Patent
Di Cioccio et al.

(10) Patent No.: US 9,027,821 B2
(45) Date of Patent: May 12, 2015

(54) PROCESS FOR DIRECT BONDING TWO ELEMENTS COMPRISING COPPER PORTIONS AND PORTIONS OF DIELECTRIC MATERIALS

(75) Inventors: Lea Di Cioccio, Saint Ismier (FR); Pierric Gueguen, Echirolles (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 143 days.

(21) Appl. No.: 13/811,498

(22) PCT Filed: Jul. 21, 2011

(86) PCT No.: PCT/EP2011/062540
§ 371 (c)(1),
(2), (4) Date: May 1, 2013

(87) PCT Pub. No.: WO2012/010662
PCT Pub. Date: Jan. 26, 2012

(65) Prior Publication Data
US 2013/0270328 A1 Oct. 17, 2013

(30) Foreign Application Priority Data
Jul. 21, 2010 (FR) .................................... 10 55936

(51) Int. Cl.
*B23K 31/00* (2006.01)
*B23K 31/02* (2006.01)
(Continued)

(52) U.S. Cl.
CPC ................ *H01L 21/70* (2013.01); *H01L 24/11* (2013.01); *H01L 24/81* (2013.01); *H01L 24/12* (2013.01);
(Continued)

(58) Field of Classification Search
CPC ........... H01L 2224/81894; H01L 2224/83894; H01L 2225/06513; H01L 24/11; H01L 24/81; H01L 2924/01029; H01L 24/12; H01L 24/16; H01L 24/28; H01L 24/32; H01L 24/73; H01L 24/83; B23K 20/02
USPC ................ 228/120, 121, 122.1, 123.1, 124.1, 228/124.5
See application file for complete search history.

(56) References Cited

U.S. PATENT DOCUMENTS

| | | | |
|---|---|---|---|
| 6,346,678 B1 * | 2/2002 | Kono et al. ................... | 174/255 |
| 2004/0262772 A1 | 12/2004 | Ramanathan et al. | |

(Continued)

FOREIGN PATENT DOCUMENTS

EP      1 742 261 A1     1/2007

OTHER PUBLICATIONS

Preliminary French Search Report Issued Mar. 29, 2011 in Patent Application No. 1055936 (with English translation of Categories of Cited Documents).

(Continued)

*Primary Examiner* — Erin Saad
(74) *Attorney, Agent, or Firm* — Oblon, McClelland, Maier & Neustadt, L.L.P.

(57) ABSTRACT

A process of assembly by direct bonding of a first and second element, each having a surface including copper portions separated by a dielectric material, the process includes: polishing the surfaces such that the surfaces to be assembled allow assembly by bonding; forming a diffusion barrier selectively in copper portions of the first and second elements, wherein the surface of the diffusion barrier of the first and second elements is level with the surface, to within less than 5 nanometers; and bringing the two surfaces into contact, such that the copper portions of one surface cover at least partly the copper portions of the other surface, and such that direct bonding is obtained between the surfaces.

18 Claims, 2 Drawing Sheets

(51) Int. Cl.
*H01L 21/70* (2006.01)
*H01L 25/00* (2006.01)
*H01L 27/00* (2006.01)
*H01L 23/00* (2006.01)
*H01L 21/20* (2006.01)
*H01L 23/48* (2006.01)
*H01L 25/065* (2006.01)

(52) U.S. Cl.
CPC ........... *H01L 21/2007* (2013.01); *H01L 23/481* (2013.01); *H01L 24/03* (2013.01); *H01L 24/05* (2013.01); *H01L 24/06* (2013.01); *H01L 24/80* (2013.01); *H01L 25/50* (2013.01); *H01L 2224/0401* (2013.01); *H01L 2224/0557* (2013.01); *H01L 2224/05647* (2013.01); *H01L 2224/81894* (2013.01); *H01L 2224/83894* (2013.01); *H01L 2924/01012* (2013.01); *H01L 2924/01013* (2013.01); *H01L 2924/01014* (2013.01); *H01L 2924/01022* (2013.01); *H01L 2924/01027* (2013.01); *H01L 2924/01029* (2013.01); *H01L 2924/01046* (2013.01); *H01L 2924/0105* (2013.01); *H01L 2924/01058* (2013.01); *H01L 2924/01073* (2013.01); *H01L 2924/01074* (2013.01); *H01L 2924/01078* (2013.01); *H01L 2924/01079* (2013.01); *H01L 2924/01005* (2013.01); *H01L 2924/01006* (2013.01); *H01L 2924/01019* (2013.01); *H01L 2924/01023* (2013.01); *H01L 2924/01072* (2013.01); *H01L 25/0657* (2013.01); *H01L 2225/06541* (2013.01); *H01L 24/08* (2013.01); *H01L 2224/80357* (2013.01); *H01L 2224/80895* (2013.01); *H01L 2224/80896* (2013.01); *H01L 2224/08121* (2013.01); *H01L 2224/05166* (2013.01); *H01L 2224/05181* (2013.01); *H01L 2224/05186* (2013.01)

(56) References Cited

U.S. PATENT DOCUMENTS

| | | |
|---|---|---|
| 2005/0003664 A1 | 1/2005 | Ramanathan et al. |
| 2005/0079685 A1 | 4/2005 | Ramanathan et al. |
| 2005/0104216 A1 | 5/2005 | Cabral, Jr. et al. |
| 2007/0035029 A1 | 2/2007 | Caubet et al. |
| 2007/0232023 A1 | 10/2007 | Tong et al. |
| 2010/0133634 A1 | 6/2010 | Caubet et al. |
| 2011/0041329 A1 | 2/2011 | Tong et al. |
| 2012/0097296 A1 | 4/2012 | Di Cioccio et al. |
| 2012/0100657 A1 | 4/2012 | Di Cioccio et al. |

OTHER PUBLICATIONS

Geraldine C. Schwartz et al., "Handbook of Semiconductor Interconnection Technology", CRC Press, 2$^{nd}$ edition, Feb. 22, 2006, pp. 430-431 and cover pages.

J. Gambino et al., "Self-aligned metal capping layers for copper interconnects using electroless plating", Microelectronic Engineering, vol. 83, 2006, pp. 2059-2067.

* cited by examiner

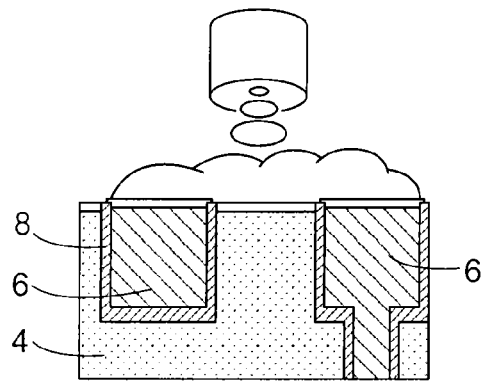
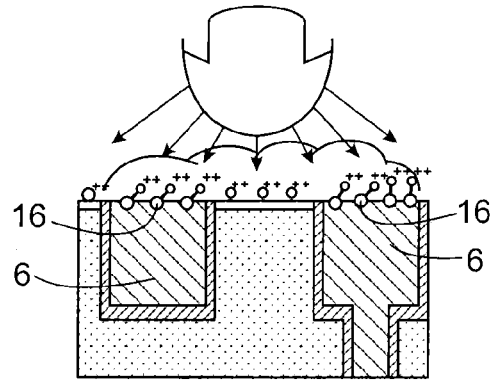
FIG.3A  FIG.3B
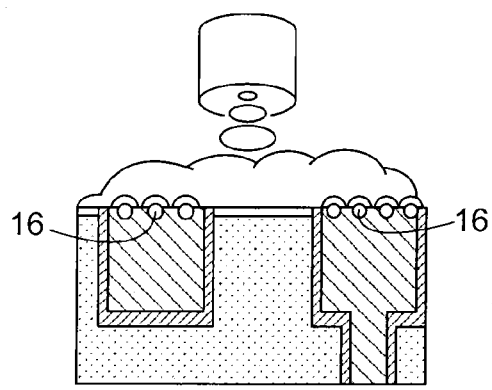
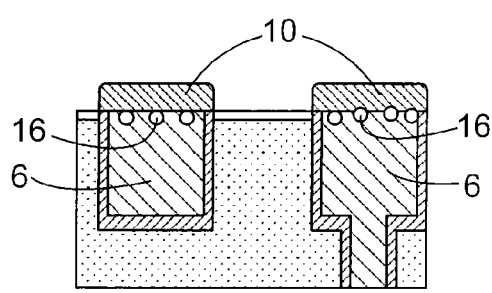
FIG.3C  FIG.3D
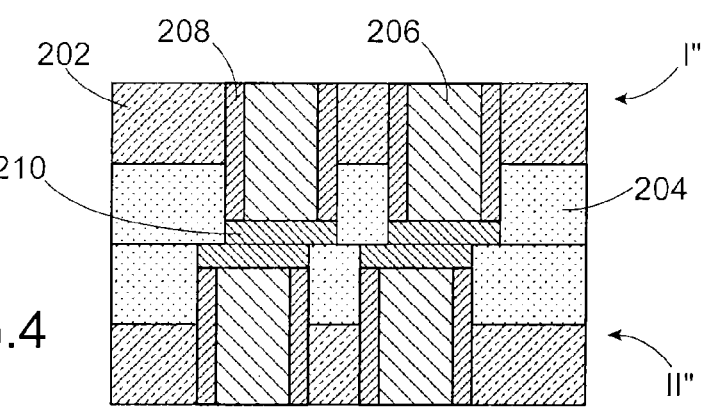
FIG.4

PROCESS FOR DIRECT BONDING TWO ELEMENTS COMPRISING COPPER PORTIONS AND PORTIONS OF DIELECTRIC MATERIALS

TECHNICAL FIELD AND PRIOR ART

The present invention relates to a process for assembling two elements by direct bonding between two surfaces comprising both copper portions and portions made of dielectric material; this process can be used in particular in the production of microelectronic and nanoelectronic devices.

Three-dimensional integration in microelectronic and nanoelectronic devices enables the size of the devices to be reduced, their electrical consumption to be reduced, and transmission speeds, performance, operating frequency, etc. to be increased.

Three-dimensional integration comprises in particular the steps of bonding with alignment of the bonding pads, thinning and vertical interconnection through the stack.

TSV (Through-Silicon Via) technology is used, which consists in making connecting vias through the silicon. However, to obtain a high interconnection density, and to simplify the technology, it is preferable to assemble the elements, and in particular the connections, directly by metal-metal bonding.

Copper is one of the metals which is particularly widely used to produce bonding pads.

Various processes exist for direct copper-copper bonding: by thermocompression or in an ultra-high vacuum, where the surfaces have been activated by means of an argon plasma. These processes enable satisfactory results to be obtained; however, they require either an ultra-high vacuum for the preparation of the surfaces, or a high temperature to accomplish the bonding, or that the work is carried out in a particular atmosphere. Application of pressure may damage the microelectronic and nanoelectronic devices.

The surfaces to be assembled can consist of portions of copper separated by portions of dielectric material, or portions of copper delimited within an area of semiconductor material by electrical isolation dielectric areas.

When the copper pads are brought into contact the free faces of the copper pads of one surface are aligned with the free faces of the copper pads of the other surface. This alignment is generally not perfect, a portion of area of the pads may then be in contact with the dielectric material. And this contact can cause copper diffusion from one area into the dielectric material of the other area, which can be problematic for the transistors and microelectronic and nanoelectronic devices, and cause prohibitive leakage currents.

One aim of the present invention is consequently to provide a new process of producing a structure comprising facing mixed areas, comprising copper and other materials, for example dielectric materials, in which the copper diffusion into the other materials of the assembled facing face is limited, or prevented.

DESCRIPTION OF THE INVENTION

The previously stated aim is accomplished by a direct bonding process, during which, before the elements to be bonded are brought into contact, the surfaces to be brought into contact are polished, so as to attain a very low degree of roughness, and an electrically conductive, self-aligned diffusion barrier is produced in the copper areas.

Before they are brought into contact the areas can be reactivated, for example by plasma.

In other words, assemblies are made of elements comprising copper portions having diffusion barriers which are self-aligned by direct bonding. These barriers do not inhibit either the bonding, or the level of electrical conduction in the assembled facing copper areas.

In an advantageous embodiment the roughness of the surfaces in the areas which are brought into contact when the surfaces are brought into contact for bonding is preferably less than 1 nm RMS, and even more preferably less than 0.5 nm RMS.

Such a roughness value may be obtained by chemical mechanical polishing.

The thickness of the self-aligned diffusion barrier deposited on the copper can be at most equal to the depth of the dishings formed on the surface of the copper portions during polishing; the depth of the dishings is, for example, of the order of 20 nm. In an advantageous variant, the self-aligned diffusion barrier can be recessed relative to the remainder of the surface.

Thus, if the second diffusion barriers are recessed relative to the surface of the elements, when the elements are brought into contact, the bonding takes place in the dielectric areas, and a subsequent heat treatment allows bonding in the copper areas. If the second diffusion barriers are projecting, when they are brought into contact, the bonding takes place in the copper pads, and heat treatment allows bonding in the dielectric areas. Finally, if the surface is sufficiently level, i.e. the surfaces of the dielectric areas and the surface of the copper areas are roughly in the same plane, bonding takes place directly over all the surfaces, when they are brought into contact. The heat treatment which takes place during or after the time when they are brought into contact in this case enables the bonding energy to be increased.

The subject-matter of the present invention is then a process for assembling, by direct bonding, a first and a second element, where each has a surface comprising copper portions separated by at least one dielectric material, and where said process comprises:

A) at least one step of polishing of said surfaces of the first and second elements, such that the surfaces to be assembled are compatible with assembly by bonding, in terms of roughness and hydrophilicity, B) a step of formation of a diffusion barrier selectively on the copper portions of the first and second elements, such that the surface of the diffusion barrier of the first and second elements is level with said surface, to within less than 5 nanometers, and C) a step of bringing the two surfaces into contact, such that the copper portions of one surface cover at least partly the copper portions of the other surface, forming overlapping areas, and such that direct bonding is obtained between the surfaces.

The alloy of the diffusion barrier is for example CoWB, CoWP or CoWBP.

Step A) preferably comprises:

a) at least one step of polishing the surfaces so as to obtain a roughness of less than 1 nm RMS, and hydrophilic surfaces, b) at least one step of cleaning said surfaces in order to eliminate the presence of particles due to the polishing, and most of the corrosion inhibitors.

Step C) advantageously comprises, before the surfaces are brought into contact, a step of reactivation of the surfaces, such that they have a hydrophilic character.

Reactivation of the surfaces is obtained preferentially by plasma, for example $He/H_2$ or $N_2/H_2$ or $O_2/H_2$ plasma.

The action of bringing the surfaces into contact of step C) advantageously takes place at ambient temperature and at atmospheric pressure.

In an example embodiment the direct bonding of step C) between the copper portions in the overlapping areas takes place at ambient temperature and at atmospheric pressure.

In another example embodiment the direct bonding in the overlapping areas between the copper portions takes place after heat treatment.

In an example embodiment step B) comprises the following steps:

b1) cleaning of the surfaces of the elements and removal of the native copper oxide, b2) deposition of a catalyst on the surfaces, for example palladium, which reacts with the copper, b3) electrolytic growth of the diffusion barrier over a given thickness.

The material of the diffusion barrier may then be a cobalt-based ternary alloy.

In another example embodiment, step B) comprises the following steps:

b1') cleaning of the surfaces of the elements and removal of the native copper oxide, b2') growth of said diffusion barrier in the copper portions by means of a self-activated solution.

Starting with elements comprising a substrate, where a layer of dielectric material is deposited on the substrate, where said layer of dielectric material has been etched, where a copper layer overlaps the layer of dielectric material and fills the etchings of the layer of dielectric material, step A) of polishing can comprise the following sub-steps:

a1) chemical mechanical polishing of the copper layer of each element with a levelling chemical solution, until a roughly level copper surface is obtained, a2) chemical mechanical polishing of the remaining copper layer with a selective non-levelling chemical solution until all the copper on the layer of dielectric material outside the etchings has been removed.

According to another characteristic, if the elements comprise another diffusion barrier between the layer of dielectric material and the copper layer, in step a2), the copper layer can be polished until it disappears in the other diffusion barrier outside the etchings.

According to another characteristic, the copper can, for example, be recessed from the surface of the dielectric material. The growth of the diffusion barrier can, for example, be stopped when its thickness is at most equal to the distance between the surface of the layer of dielectric material and the recessed copper surface.

BRIEF DESCRIPTION OF THE ILLUSTRATIONS

The present invention will be better understood using the description which follows and the appended illustrations, in which:

FIGS. 3A to 3D are schematic representations of an example of deposition of self-aligned diffusion barriers;

FIG. 4 is a section view of a variant of an assembly obtained according to the process of the present invention.

DETAILED ACCOUNT OF PARTICULAR EMBODIMENTS

The process according to the present invention consists in direct bonding, for example between two surfaces comprising copper portions and portions of dielectric material, for example $SiO_2$. As a variant, it is possible that at least one of the surfaces comprises copper portions delimited by portions of dielectric material within portions of a third material, for example a semiconductor material.

Assembly of two elements of which the surfaces to be brought into contact do not have the same structure does not go beyond the scope of the present invention.

Direct bonding, sometimes called molecular bonding, is understood as the action of bringing into contact two roughly level surfaces, during which these two roughly level surfaces adhere to one another without any addition of adhesive material.

In the following description, the process according to the present invention will be described in the context of the bonding of two elements intended for production of microelectronic on nanoelectronic devices, more specifically to produce the connection of copper bonding pads, but the process according to the present invention applies to the bonding of copper portions which are not necessarily bonding pads. They may be, for example, through-silicon vias, as represented schematically in FIG. 4. In addition, the process according to the invention may be used in all fields in which it is desired to assemble mixed surfaces comprising copper, whilst preventing an undesired diffusion of the copper.

Figure 1A:
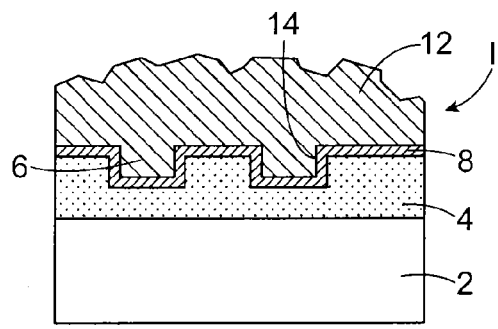
FIGS. 1A to 1D are schematic representations of different steps of an example of a bonding process according to the present invention.
Figure 1B:
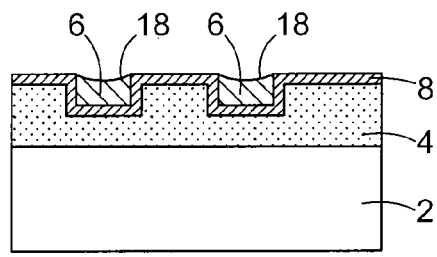
Figure 1C:
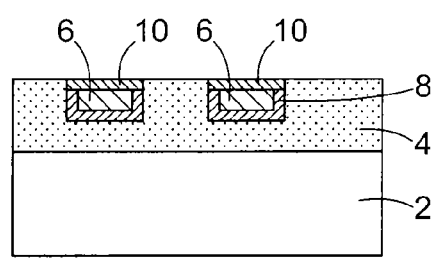
Figure 1D:
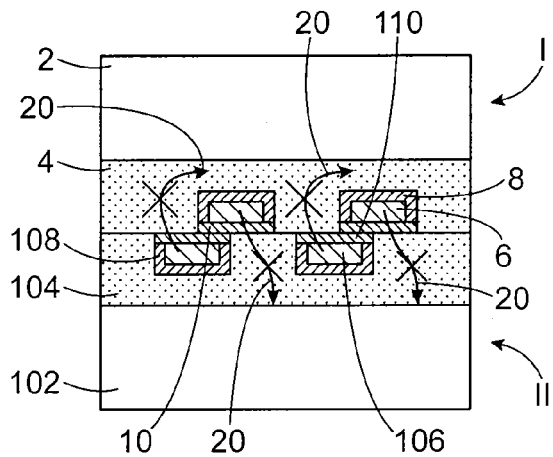

In FIG. 1D a first I and a second II elements assembled by the process according to the present invention can be seen.

First element I comprises a substrate 2, made for example of silicon, a layer made of dielectric material 4, for example $SiO_2$, copper pads 6 in etched areas of dielectric material 4, a first diffusion barrier 8 between layer of dielectric material 4 and copper pads 6 and a layer 10 on each of pads 6 forming a second copper diffusion barrier.

First diffusion barrier 8 is, for example, made of TiN or more generally a metal in which copper diffusion is low, and which adheres satisfactorily to the dielectric on which it is deposited. Platinum or tungsten, for example, can be used as a diffusion barrier. It may also be a stack of several layers, for example Ti/TiN or Ta/TaN.

The dielectric material is advantageously $SiO_2$, but it may, more generally, be an oxide or a nitride, such as SiOCH, SiN or SiCN for example, or a polymer.

Second element II, which is represented in FIG. 1D, is similar. It also comprises copper pads 106 in a layer of dielectric material 104, where pads 106 are covered with a second copper diffusion barrier 110. A first diffusion barrier 108 is also present between pads 106 and layer of dielectric material 104.

As a variant, and as represented in FIG. 4, elements I" and/or II" could comprise pads 206 which penetrate all the way through substrate 202, forming through-silicon vias (TSV) whilst being electrically isolated from this substrate by a dielectric area 204 surrounding pads 206. A first diffusion barrier 208 could be comprised in the same way between pad 206 and this dielectric area 204. A second diffusion barrier 210 is also deposited on pads 206.

Second diffusion barriers 10, 110 are called "self-aligned", i.e. they are precisely aligned with the copper areas of interest, without there being any requirement to be concerned with this alignment. The alignment is obtained as a direct consequence of the process of deposition chosen for these barriers, namely selective growth of these barriers on the copper. Diffusion barriers 8, 108 are, for their part, advantageously deposited on the entire surface of the dielectric material before deposition of the copper. Examples of processes of deposition of the second diffusion layer will be described subsequently in the description.

The object of the process according to the present invention is to assemble these two elements I, II, such that pads 6 of first element I are at least partly in contact with pads 106 of second element II, providing satisfactory electrical conduction between elements I and II.

The process according to the present invention comprises:
- at least one step A) of polishing of the surfaces to be brought into contact,
- a step B) of formation of a diffusion barrier on the free surface of the copper pads,
- a step C) of bringing the surfaces into contact, causing hydrophilic direct bonding of the two elements by said surfaces. This step may advantageously take place at ambient temperature and at atmospheric pressure.

Step A) comprising:
a) a step of polishing of elements I, II so as to release surfaces having pads 6, 106, and such that the two elements have, in the area of the portions brought into contact, a roughness and a hydrophilicity which allow direct bonding in these areas in contact as soon as they are brought into contact.

The roughness is preferably lower than 1 nm RMS, or even more preferably lower than or equal to 0.5 nm RMS. This step may possibly also enable surfaces formed of dielectric material 4 to be released, b) preferably, a step of cleaning said surfaces in order to eliminate the presence of particles due to the polishing. On conclusion of this step the faces are hydrophilic.

A step of reactivation of at least the portions of dielectric material can advantageously be comprised before the step of bringing the surfaces into contact, in order that the surfaces are hydrophilic.

We shall now describe in detail the process of bonding according to the present invention, enabling the assembly of FIG. 1D to be obtained.

Elements I and II are produced according to the same steps.

On a substrate 2 comprising at its surface a dielectric layer 4, dielectric layer 4 is etched locally to a certain depth which is less than its thickness at locations 14 intended to receive copper pads 6. A layer 8 forming a diffusion barrier is then deposited in a conformal manner. This layer may have a broad thickness range (typically 5 nm to 100 nm).

In FIG. 1A an element I' can be seen after deposition on this stack of a copper layer 12 to produce pads 6.

Copper layer 12 is deposited on first layer 8 forming a diffusion barrier.

In a subsequent step represented in FIG. 1B, copper layer 12 is polished until dielectric material 4 is exposed outside etched areas 14.

Figure 2A:
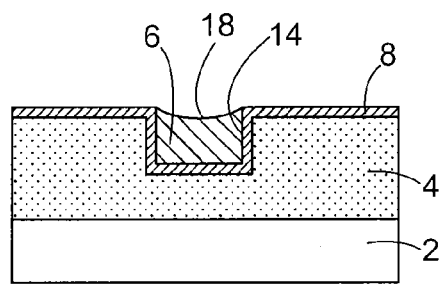
FIGS. 2A and 2B are schematic representations of the polishing step.
Figure 2B:
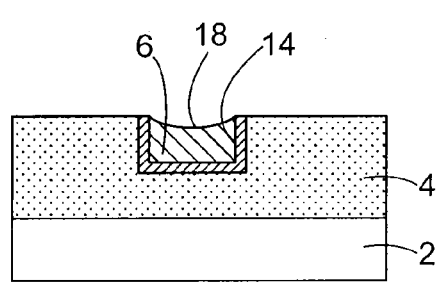

This polishing takes place in two steps represented in FIGS. 2A and 2B. A first step consists in polishing copper layer 12 until the first diffusion barrier is uncovered (FIG. 2A) and, subsequently, in polishing first diffusion layer 8 until dielectric material 4 is uncovered (FIG. 2B); the polishing of this step is advantageously such that the surface of dielectric material 4 and that of the copper are roughly at the same level. A difference of a few nanometers, typically 5 nm, which depends on the size and density of the copper pads, may be accepted and still be compatible with direct bonding. The surface of the pads may therefore either be recessed from the surface of the dielectric material, or projecting from the surface of the dielectric material.

The polishing is also advantageously such that the roughness of the surface of dielectric material 4 and of the copper is lower than 1 nm RMS (Root Mean Square), and advantageously lower than 0.5 nm RMS.

The step of polishing, which enables the structure of FIG. 1A to be transformed to the structure of FIG. 2B is, for example, based on CMP (Chemical Mechanical Polishing).

In a first polishing step a1) copper layer 12 is levelled to eliminate the reliefs obtained after deposition of copper layer 12, due notably to etched areas 14, and by this means to obtain a roughly level layer 12. To this end chemical mechanical polishing is undertaken with a levelling chemical. A chemical or slurry is said to be "levelling" when it enables the steps present after material has been deposited on a structure to be reduced. The term "slurry" means particles in suspension in an acidic or basic chemical solution.

Subsequently, in a step a2), polishing is undertaken, the purpose of which is to remove the copper layer located on first diffusion barrier 8 outside etched zones 14, and by this means to expose this first diffusion barrier 8 in these areas. To accomplish this, chemical mechanical polishing is undertaken with a non-levelling, selective slurry on the diffusion barrier, i.e. it attacks the copper and does not attack the diffusion barrier. The free surfaces of the copper pads then have a dish-shaped profile 18, also called dishing. The depth of these dishings is, for example, of the order of 20 nm.

The depth of the dishings may be controlled by the polishing parameters, for example by the pressure, the polishing time and the choice of the slurry or slurries used.

In a subsequent step a3), the diffusion barrier, and possibly a portion of the dielectric material, are removed.

We shall now describe in greater detail the means which can be used to undertake the chemical mechanical polishing in implementing the present invention.

The surface of element I' to be polished is rubbed on a fabric called a "pad" consisting of viscoelastic porous polyurethane and the properties of which (hardness, compressibility, shape and dimension of the pores and of the patterns, etc.) depend on the nature of the material to be polished. The material(s) on the surface of element 2 is (are) torn off by chemical reaction and mechanical action using the fabric and/or a solution containing particles, also called a "slurry" (particles in suspension in an acidic or basic chemical solution). These slurries can consist of particles of nanometric sizes in a liquid solution (colloidal solution, micelle solution, Langmuir-Blodget solution, etc.).

The polishing is obtained through a combination of several actions:
- a mechanical action obtained by rubbing the fabric and/or the slurry particles on the surface. The speed of removal of the material has been modelled by Preston in the following equation:

$$RR = K_p \times P \times V \qquad [1]$$

where:
RR (Removal Rate): rate of removal at a given point (nm/min),
$K_p$ = Preston's constant taking into account the characteristics of the material, the fabric, the type of abrasive, the temperature, etc.
P = Applied pressure (Newton),
V = Linear speed of a point of the plate relative to the fabric (m/s),
- a chemical action; during polishing it is desired to polish copper and the dielectric material simultaneously. The slurries are therefore chosen such that they have a chemical action on the copper and on the dielectric material. As regards the copper, the chemical action generally results from an attack with an acid and/or an oxidiser allowing a reaction with the surface to be polished to take place.

A slurry generally contains a chemical agent which attacks metals, an oxidiser (generally $H_2O_2$), a pH-stabilising agent added to the acidic or basic solution of the slurry, and a corrosion inhibitor. The chemical solution will passivate (K1) the material by forming on its surface a metallic oxide which will be removed mechanically (K2) by the fabric, and by the slurry particles, if applicable.

The chemical solution will then be formed of $CuO_X$.

This chemical reaction facilitates and accelerates the polishing mechanism. Other chemical reactions can be engendered through the formation of soluble copper/copper$^+$ or copper/$Cu^{2+}$ metallic cations, and these can be removed from the surface to be polished by the fabric and/or the slurry particles.

In respect of the dielectric material, the slurries used are generally aqueous solutions.

Water is very useful for polishing dielectrics, for example a silicon oxide. Two chemical reactions are involved.

Firstly, the water penetrates under the effect of the pressure, and breaks some Si—O bonds of the silicon oxide to form a hydrated surface.

Separation of the (Si—O—Si) bonds is controlled by the diffusion of the water in the silicon dioxide. The polishing takes place when the following reversible hydration reaction (polymerisation):

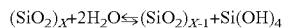

is able to occur in the reverse direction, i.e. in the direction of hydration (depolymerisation), as notably described in the work "*Handbook of Semiconductor Interconnection Technology*" by G C Schwarz.

The movement of the fabric relative to the silicon plate then enables the slurry particles to be torn from the surface, thus removing atoms of the surface material.

To produce a chemical attack both of the copper and of the dielectric material it is possible to use an aqueous solution obtained by solubilisation in deionised water:
- of one or two complexing agents or metal etching agents, and of the metal compounds (glycine, NH3, EDTA, etc.), if applicable, enabling the copper polishing speed to be increased,
- of a copper corrosion inhibitor (benzotriazole BTA, triazole TA, etc.), an agent passivating the copper film reduces the polishing speed specifically in the lower areas to be levelled. Two inhibitors are often used,
- of a surfactant to stabilise the pH, improve the selectivity of polishing of the copper relative to the other materials used, etc.
- of an oxidising agent ($H_2O_2$, $KIO_2$, hydroxylamine, etc.) which, depending on the pH and/or its concentration, can form either a passivation of the copper by an insoluble copper oxide or hydroxide, or a corrosion by a metallic cation which is soluble in the aqueous solution,
- of anionic or cationic colloidal particles, having a pH of between 1 and 12, are advantageously added to obtain a stable particle suspension. The particles can be pure, such as silicon dioxide, carbon, cerium oxide, alumina or polymers. The sizes of the elementary particles will be determined by the solutioning process chosen. They may vary between 3 nm and 300 nm. The percentage by mass of particles in the aqueous solution may be between a few ppm and 50%.

As an example, the following aqueous solutions may be used:
- for step a1), slurry EPL2361, sold by the company CMC (Cabot Microelectronic Corporation), or CoppeReady®CU3900 of DANM (Dupont Air Product Nanomaterials L.L.C), may be used,
- for step a2), slurry DP510 of DANM or RL3000 of Rohm & Haas, or HS-C930-3 of Hitachi or C7092 of CMC, may be used,
- for step a3), slurry CuS-1351 of Rohm & Haas, or B8500 of CMC, or DP6545 of DANM, or T815 of Hitachi, or FCB-837 of Fujimi corporation, may be used.

The characteristics of the polishing fabrics used notably depend on the dimensions of the cavities made in an insulating material and filled with copper, with or without a diffusion barrier or bonding layer.

As an example, in the case of cavities wider than 10 μm, polyurethane fabrics known as "levelling fabrics" are chosen, with "shore D" hardness of 50 to 70, density of 60 to 90 mg/cm$^3$, and compressibility of less than 4%, for example IC1000 of the company Rohm & Haas, or D100 of the company CMC.

In the case of cavities smaller than 10 μm, "medium" fabrics may for example be chosen, with "shore A" hardness of 50 to 70, density of 20 to 40 mg/cm$^3$, and compressibility of between 10 and 25%. For this application, Suba IV from the company Rohm & Haas, for example.

In the case of cavities of the order of one micrometer in size, since certain ductile materials may be scratched by the particles, polishing fabrics known as "finish polishing fabrics" are preferred, with "shore A" hardness of 50 to 80, density of <20 mg/cm$^3$, and compressibility of >30%, for example POLITEX® from the company Rohm & Haas, or fabrics of the Fujibo® brand.

The elements are, for example, processed on traditional polishing machines, for example of the Mirra or Reflexion types, of Applied Materials USA, Megapol M550 of Alpsitec France or FREX of Ebara Japan.

The polishing parameters are the pressing pressure applied to the substrate, of between 0.02 daN/cm$^2$ and 1 daN/cm$^2$; the speed of a point of the substrate relative to a point of the fabric is between 0.1 m/s to 3 m/s; the flow rate of the aqueous solution is between 5 and 300 ml in the case of substrates varying between 1 and 450 mm; and the temperature is between 2 and 70° C.

The conditions for the abovementioned applications are preferentially 0.1 daN/cm$^2$, with a speed of 1 m/s, and an aqueous solution flow rate of 150 ml for substrates of 200 mm at a temperature of 52° C.

After the step of chemical mechanical cleaning, a step of cleaning is generally comprised, for example by brushing plates in a chemically neutral medium (i.e. in the presence of water) or in an alkaline medium, notably to eliminate the polishing residues.

In a subsequent step represented in FIG. 1C, second diffusion barrier 10 is deposited on copper pads 6.

The thickness of second diffusion barrier 10 may be roughly equal to the depth of the dishings formed on the surface of pads 6.

The surface of second diffusion barrier 10 is advantageously recessed relative to the remainder of the surface to be assembled, whilst remaining compatible with the direct bonding step. This recess is preferably less than 5 nm.

The case in which the diffusion barrier is projecting relative to the remainder of the surface by several nanometers, typically 5 nm, is acceptable and is still compatible with the subsequent direct bonding step.

In FIG. 1C, the free surface of second diffusion barrier 10 is level with the free surface of layer of dielectric material 4.

In FIGS. 3A to 3D an example of a process of production of second diffusion barrier 10 can be seen represented schematically.

In a first step (FIG. 3A), the surface of the element of FIG. 2B is cleaned and the native copper oxide is removed by means of a rinsing solution. A drying operation can then be undertaken, for example under nitrogen flow.

In a following step a solution containing a catalyst, for example palladium or boron, is vaporised, on the surface of the element (FIG. 3B). This catalyst reacts with the copper. Rinsing can then be undertaken to remove the excess catalyst which has not reacted. The catalyst which has reacted forms islands 16 on copper pads 6.

In a subsequent step the diffusion barrier is made to grow on pads 6, and islands 16 act as catalysts for this deposition. It is, for example, autocatalytic growth, as represented in FIG. 3C. The thickness of second diffusion barrier 10 is controlled by time. The growth is implemented, for example, by electrolysis in solution.

The material of the second diffusion barrier is a cobalt or nickel alloy, for example the alloy CoWP.

The growth of second diffusion barrier 10 is stopped, for example, by rinsing followed by drying.

As a variant, a self-activated solution may be used, i.e. one containing the catalyst in solution; in this case the step of deposition of the catalyst is not required. In this case the material of the second diffusion barrier may, for example, be the alloy CoWB or CoWPB if the solution used is DMAB (dimethylaminoborane).

Second diffusion barrier 10 is advantageously made of cobalt or nickel binary or ternary alloys. These alloys have properties as barriers against copper diffusion.

In addition, they have the advantages that they have localised and selective growth on the lines of copper, independently of the copper microstructure and of its crystallinity, that they have better adhesion with copper than a dielectric barrier, that they are conductive and that they improve reliability.

The material for the second diffusion barrier may for example be chosen from among the following list: CoWB, CoWP, NiP, NiWB, NiW, NiB, NiReP, NiMoP, NiWP, CoWPB, CoWBO, CoMoPO, etc.

The process of deposition of these materials is similar to that described above.

Materials having low resistivity are preferably chosen, for example resistivity less than 1 ohm·cm, and/or having a relatively low deposition temperature, typically less than 400° C., or 200° C., and/or having great temperature stability. This is preferably CoWP, which can be deposited at 100° C. CoWP remains stable up to 400° C. and has resistivity of less than 40 µohm·cm.

Deposition of diffusion barrier 10 on the copper does not cause any increase of surface roughness. The free surface of the second diffusion barrier consequently has a roughness of less than 1 nm RMS.

When both elements are ready, and if it proves necessary, the surfaces to be brought into contact, and in particular the surfaces of the layers of dielectric material, are reactivated, in order to make them compatible for direct bonding, i.e. to make the surfaces hydrophilic.

In the present application a surface is considered to be hydrophilic if the contact angle is between 0° and 20°; the angle is preferably as low as possible.

Reactivation may be obtained by plasma, for example $He/H_2$ or $N_2/H_2$ or $O_2/H_2$ plasma. Plasma reactivation has the advantage that it does not modify the roughness of the reactivated surfaces.

As an example, plasma treatment may be implemented using the Endura 5500B® device, for example under the following conditions: for 60 s at a power level of 450 W, with a pressure of 80 mTorr at ambient temperature, and with the gas $He/H_2$.

As a variant, chemical reactivation may be envisaged with, for example an HF or $H_2SO_4$ chemistry, followed by a cleaning step.

Both surfaces are then placed face-to-face (FIG. 1D); copper pads 6 covered with the cobalt alloy or nickel alloy second diffusion barrier are brought roughly opposite copper pads 106 covered with second diffusion barrier 110, and the surfaces are brought into contact. The areas then come into adhesive contact by hydrophilic direct bonding; this direct bonding may be obtained at ambient temperature and at atmospheric pressure. The cobalt or nickel alloy second diffusion barrier is compatible with bonding, and also with direct bonding.

When the surfaces of the elements to be brought into contact are sufficiently level, i.e. the surface of the dielectric areas and the surface of the copper areas are roughly in the same plane, bonding takes place directly over all the surfaces, at the instant when they are brought into contact.

A heat treatment at a temperature of at least 200° C., for example 400° C., may be applied during or after the operation to bring the surfaces into contact, and in this case enables the bonding energy to be increased.

In the advantageous case in which the second diffusion barrier is recessed, the surfaces brought into contact in step c) start by adhering in the dielectric areas, advantageously at ambient temperature and pressure; a heat treatment is then implemented at a temperature of at least 200° C., for example 400° C., to allow the copper to expand, the material of the diffusion barriers to come into contact, and finally bonding between these copper areas.

Typically, in the case of copper pads having sides measuring 10 µm and which are 500 nm thick, a recess of the order of 5 to 10 nm could be eliminated during the heat treatment. The layer forming the second diffusion barrier will typically be 1 to 20 nm thick.

If there is a bonding area in the recessed copper, this provides the advantage that the bonding takes place only in the dielectric areas when the surfaces are brought into contact. If it is accomplished at low temperature, typically at ambient temperature, the bonding is therefore weak. It is then possible, after this step of bringing the surfaces into contact, and before the step of heat treatment, to check, for example by infrared inspection of alignment crosses designed for this purpose, the alignment of the two elements and, if required, to separate the two elements, which are adhering weakly in the dielectric areas, and to re-bond them more satisfactorily before proceeding with the heat treatment, which will both consolidate the bonding in the dielectric areas, but also enable the copper to expand, and enable bonding in the copper areas. When the bonding is accomplished firstly in the metal areas the surfaces adhere strongly and cannot easily be separated.

Elimination of the recess of the copper pads by heat treatment depends, among other factors, on the dimensions of the copper pads, and on the temperature conditions of the heat treatment. The skilled man in the art will therefore choose the values of the recess of the pads before bonding in accordance with these parameters. In addition, it is conceivable that the recesses of the copper pads in the two elements to be assembled may have different values.

If the second diffusion barriers are projecting, when they are brought into contact, the bonding takes place firstly in the copper areas, and heat treatment allows bonding in the dielectric areas.

Heat treatment also allows satisfactory electrical conduction between the facing copper areas.

Heat treatment may be undertaken in all cases to improve the mechanical resistance of the assembly.

In all cases, the bonding ultimately takes place over all surfaces of both elements, except the plates' chamfer areas.

If there is misalignment of the copper pads copper diffusion in the dielectric material is prevented by second diffusion barriers 10, 110. The fact that there is no diffusion of the copper of pads 6, 106 to layer of dielectric material 104, 4 of other element II, I respectively is shown symbolically by crossed arrows 20.

A choice may be made to initiate the bonding by applying a localised pressure on the edge of one of the two elements in the direction of the bonding area.

The bonding process according to the present invention allows elements comprising copper pads to be assembled very simply whilst preventing copper diffusion in the dielectric material. In addition, it obviates any need to use heavy facilities to apply pressure and/or a vacuum and/or a high temperature.

This process is particularly suitable for the production of microelectronic devices, since it does not use high temperatures. It is clearly understood, however, that it is not limited to such an application, and that the process according to the invention may use, during annealings, temperatures of over 400° C. in other fields of application, the temperature 400° C. being the maximum temperature commonly accepted for processes on backplanes of microelectronic components, notably implying interconnections via copper lines.

The invention claimed is:

1. A process of assembly by direct bonding of a first and of a second element, the first element having a first surface including first copper portions separated by at least one first dielectric material, and the second element having a second surface including second copper portions separated by at least one second dielectric material, the process comprising:
   a) polishing the first surface and the second surface, such that the first and the second surfaces that are to be assembled are compatible with assembly by bonding, in terms of roughness and hydrophilicity;
   b) forming a first diffusion barrier selectively on the first copper portions of the first element and a second diffusion barrier selectively on the second copper portions of the second element, such that a surface of the first diffusion barrier is level with the first surface of the first element, and a surface of the second diffusion barrier is level with the second surface of the second element, each to within less than 5 nanometers, the first diffusion barrier and the second diffusion barrier being a cobalt or nickel alloy; and
   c) bringing the first surface of the first element into contact with the second surface of the second element, such that the first and second copper portions at least partly cover each other, forming overlapping areas, and such that direct bonding is obtained between the at least one first dielectric material and the at least one second dielectric material, and along the overlapping areas of the first and the second copper portions.

2. The process of assembly by direct bonding according to claim 1, in which the a) polishing comprises:

a1) polishing the first and the second surfaces so as to obtain a roughness of less than 1 nm RMS, and hydrophilic surfaces;
   a2) cleaning the first and the second surfaces to eliminate presence of particles due to the polishing, and most of the corrosion inhibitors.

3. The process of assembly by direct bonding according to claim 1, in which the c) bringing comprises, before the first and the second surfaces are brought into contact, reactivation of the first and the second surfaces, such that they are hydrophilic.

4. The process of assembly by direct bonding according to claim 1, in which the c) bringing the first and the second surfaces into contact takes place at ambient temperature and at ambient pressure.

5. The process of assembly by direct bonding according to claim 4, in which the direct bonding of c) between the first and the second copper portions in the overlapping areas takes place at ambient temperature and at atmospheric pressure.

6. The process of assembly by direct bonding according to claim 1, in which the direct bonding in the overlapping areas between the first and the second copper portions is obtained by performing heat treatment.

7. The process of assembly by direct bonding according to claim 1, in which the c) bringing comprises, before the first and the second surfaces are brought into contact, reactivation of the first and the second surfaces, such that they are hydrophilic and in which the first and the second surfaces are reactivated by plasma, or by a $He/H_2$ or $N_2/H_2$ or $O_2/H_2$ plasma.

8. The process of assembly by direct bonding according to claim 1, in which the b) forming comprises:
   b1) cleaning the first and the second surfaces of the first and the second elements and removal of the native copper oxide;
   b2) depositing a catalyst or palladium on the first and the second surfaces, which reacts with the first and the second copper portions; and
   b3) electrolytic growth of the first and the second diffusion barriers over a given thickness.

9. The process of assembly by direct bonding according to claim 1, in which the alloy of the first and the second diffusion barriers is CoWB, CoWP, or CoWBP.

10. The process of assembly by direct bonding according to claim 1, in which the b) forming comprises:
    b1) cleaning the first and the second surfaces of the first and the second elements and removal of the native copper oxide; and
    b2) growth of the first and the second diffusion barriers in the first and the second copper portions by a self-activated solution.

11. The process of assembly by direct bonding according to claim 1, the first and the second elements each respectively comprising a substrate, a layer of dielectric material deposited on the substrate, the layer of dielectric material having etchings, and a copper layer covering the layer of dielectric material and filling the etchings of the layer of dielectric material, in which the a) polishing comprising:
    a1) chemical mechanical polishing of the copper layer of each of the elements with a levelling chemical solution, until a roughly level copper surface is obtained on each of the elements; and
    a2) chemical mechanical polishing of a remaining copper layer of each of the elements with a selective non-levelling chemical solution until all the copper on the layer of dielectric material outside the etchings has been removed.

12. The process of assembly by direct bonding according to claim 11, in which the first and the second elements each respectively comprise another diffusion barrier between the layer of dielectric material and the copper layer, and in a2), the copper layer of each of the elements is polished until it disappears in the other diffusion barrier outside the etchings.

13. The process of assembly by direct bonding according to claim 1, in which the first copper portions are recessed from a surface of the at least one first dielectric material and the second copper portions are recessed from a surface of the at least one second dielectric material.

14. The process of assembly by direct bonding according to claim 8, in which the first copper portions are recessed from a surface of the at least one first dielectric material and the second copper portions are recessed from a surface of the at least one second dielectric material, and in which the growth of the first and the second diffusion barriers is stopped at a thickness that is at most equal to the distance between the surface of the at least one first dielectric material and the recessed surface of the first copper portions, and that is at most equal to the distance between the surface of the at least one second dielectric material and the recessed surface of the second copper portions.

15. The process of assembly by direct bonding according to claim 9, in which the first copper portions are recessed from a surface of the at least one first dielectric material and the second copper portions are recessed from a surface of the at least one second dielectric material, and in which the growth of the first and the second diffusion barriers is stopped at a thickness that is at most equal to the distance between the surface of the at least one first dielectric material and the recessed surface of the first copper portions, and that is at most equal to the distance between the surface of the at least one second dielectric material and the recessed surface of the second copper portions.

16. The process of assembly by direct bonding according to claim 10, in which the first copper portions are recessed from a surface of the at least one first dielectric material and the second copper portions are recessed from a surface of the at least one second dielectric material, and in which the growth of the first and the second diffusion barriers is stopped at a thickness that is at most equal to the distance between the surface of the at least one first dielectric material and the recessed surface of the first copper portions, and that is at most equal to the distance between the surface of the at least one second dielectric material and the recessed surface of the second copper portions.

17. The process of assembly by direct bonding according to claim 1, wherein the at least one first dielectric material and the at least one second dielectric material are the same material.

18. The process of assembly by direct bonding according to claim 1, wherein the direct bonding is further obtained across all of the first surface and the second surface except for chamfer areas of the first and second elements.

* * * * *